US008400849B1

(12) United States Patent
Dornseifer et al.

(10) Patent No.: US 8,400,849 B1
(45) Date of Patent: Mar. 19, 2013

(54) ELECTRONIC DEVICE FOR MONITORING A SUPPLY VOLTAGE

(75) Inventors: Frank Dornseifer, Freising (DE); Ruediger Kuhn, Freising (DE); Johannes Gerber, Unterschleissheim (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/276,160

(22) Filed: Oct. 18, 2011

(51) Int. Cl.
*G11C 16/04* (2006.01)

(52) U.S. Cl. ............... 365/189.09; 365/189.07; 365/145

(58) Field of Classification Search ............. 365/189.09, 365/189.07, 145, 226
See application file for complete search history.

(56) References Cited

U.S. PATENT DOCUMENTS 6,529,421 B1 * 3/2003 Marr et al. ............... 365/189.09

OTHER PUBLICATIONS

U.S. Appl. No. 13/204,876, filed Aug. 8, 2011.

* cited by examiner

*Primary Examiner* — David Lam

(74) *Attorney, Agent, or Firm* — William B. Kempler; Wade J. Brady, III; Frederick J. Telecky, Jr.

(57) ABSTRACT

An electronic device comprising a first supply voltage domain, a second supply voltage domain and a low drop output voltage regulator (LDO) coupled to receive a supply voltage of the first supply voltage domain and to provide a supply voltage of the second supply voltage domain and the LDO being configured to be switched into a first state for providing and maintaining the supply voltage of the second supply voltage domain and into a second state for providing a high impedance output to the second supply voltage domain. The electronic device includes a comparator coupled to monitor the first supply voltage level at a first supply voltage node and to switch the LDO from the first state to the second state.

21 Claims, 6 Drawing Sheets dV/dt = 1V/100ns
DVDD
VREF2
N3A
N3B
VDDF
VREF
ΔVDDF
FAILURE DETECTION
Y0 (V)
3.0
2.0
1.0
0.0
TIME (us)
60.00
60.05
60.10
60.15
60.20

VDDF DURING SHORT CASE AND LAST COMPLETE FRAM ACCESS
SDI
NO SDI
LOWER SPC LIMIT
VDDF[V]
1.41
1.40
1.39
1.38
1.37
1.36
1.35
1.34
1.33
1.32
1.00E-09
1.00E-08
1.00E-07
TIME FOR SHORT SLOPE 1V/t [s]

ELECTRONIC DEVICE FOR MONITORING A SUPPLY VOLTAGE

FIELD OF THE INVENTION

The invention relates to an electronic device for monitoring a power supply voltage level.

BACKGROUND OF THE INVENTION

Electronic devices, in particular integrated electronic devices provide a complex functionality for all kinds of applications. There is a general need to ensure that the electronic device can operate properly in order to avoid malfunctions or failure. There are many different control and monitoring tasks that may be implemented for this purpose. One of the most important issues is to ensure that the power supply voltage level of a power supply for supplying the electronic device is within acceptable limits for proper operation of the electronic device. Monitoring circuits like power on reset (POR) circuitry or other solutions may be employed. There often comparators coupled to the power supply voltage level in order to determine whether or not the power supply voltage level remains within a target window. A major problem of monitoring the supply voltage level are sudden drops or glitches of the supply voltage level with respect to the delay that is usually induced by the comparator until the electronic device may be eventually shut down. It is therefore necessary to guarantee a sufficiently quick reaction of the monitoring circuit in order to minimize reaction time.

The input or output delay of a comparator usually depends on various factors. One of the main factors is the bias current through the differential input pair of a comparator. This bias current, which is also referred to as tail current for differential input pairs, has to be increased in order to increase the speed of the differential input pair. However, generally increasing the tail current entails an increase of the overall power consumption. Therefore, it is useful to increase the bias current only when a quick reaction of the comparator is necessary. This increased bias current should be turned off during normal operation. Some mechanisms that have been developed in order to provide this variation of the bias current are known as “adaptive biasing techniques”. Existing adaptive biasing techniques use, for example, the magnitude of the input voltage difference in order to adapt the tail current of the input stages of amplifiers or comparators through additional amplifier stages. However, this approach also contributes some delay to the automatic adaption process and makes the circuitry much more complex. Furthermore, even the adaptively biased comparators are often too slow, if they have to cope with different supply voltage levels. There are also supply voltage drops or glitches that are so fast that the response time of an adaptively biased comparator is too long.

SUMMARY OF THE INVENTION

It is a general object of the invention to provide an electronic device for monitoring a supply voltage level which has improved and faster response behavior than the electronic devices according to the prior art.

According to an aspect of the invention, an electronic device is provided that comprises a first supply voltage domain, a second supply voltage domain and a low drop output voltage regulator (LDO). The LDO is coupled to receive a supply voltage of the first supply voltage domain. The LDO is further coupled to provide a supply voltage of the second supply voltage domain. The LDO is also configured to be switched into a first state for providing and maintaining the supply voltage of the second supply voltage domain and to be switched into a second state for providing a high impedance output to the second supply voltage domain. The electronic device further comprises a comparator coupled to monitor the first supply voltage level at a first supply voltage node. The comparator comprises a differential input transistor stage having one input coupled to the first supply voltage node and the other input coupled to receive a first reference voltage level. A first current source is provided and configured to supply a current of a first magnitude and a second current source is provided and configured to supply a current of a second magnitude. The first magnitude is greater than the second magnitude and the first current source is coupled with one side to the differential input stage for supplying the differential input stage with the other side to a first node. The second current source is coupled with one side to the first node and with the other side to a second supply voltage node having a second supply voltage level. There is further a capacitor that is coupled with one side to the first node and with the other side to the first supply voltage node. Furthermore, the differential input transistor stage comprises a third input being coupled to receive a second reference voltage that is derived from the supply voltage level at first supply voltage node.

According to this aspect of the invention, the adaptively biased comparator is supplemented by a third input receiving a second reference voltage level that is dependent on the supply voltage level at the first supply voltage node. Therefore, the comparator according to this aspect of the invention receives a variable reference voltage level that takes account of the general supply voltage level at the first supply voltage node. The second reference voltage level is then advantageously configured such that the comparator can always react on the voltage drops independent from the absolute supply voltage level at first supply voltage node.

According to an aspect of the invention, the differential stage comprises a first input transistor, a second input transistor and a third input transistor. The first input transistor is coupled with a control gate to the first supply voltage node. The second input transistor is coupled with a control gate to the first reference voltage and the third input transistor being is with a control gate to the second reference voltage.

In an embodiment of the invention, the electronic device comprises a first voltage divider that is coupled to the first supply voltage node and configured to supply a divided supply voltage of the first voltage domain to the control gate of the first input transistor. Furthermore, there is a second voltage divider coupled to the first supply voltage node and configured to supply a divided supply voltage of the first voltage domain to the control gate of the third input transistor. The second voltage divider can then be configured to provide a variable second reference voltage level to the control gate of the third transistor. The second voltage reference voltage level may then be dependent on the first supply voltage level. The second voltage divider may then be configured such that the second reference voltage level is be closer to the first supply voltage level than the first reference voltage level. This provides that the comparator can react on different levels of the first supply voltage level.

In an embodiment of the invention, the third transistor can be coupled in parallel to the second transistor. This provides that in addition to a comparison with the first reference voltage level, the comparator also reacts on a comparison with the second reference voltage level.

The electronic device according to aspect of the invention may further comprise a slope detection stage that is coupled in parallel to a resistor of the first voltage divider. The slope detection stage can comprise two transistors coupled in series. A first transistor configured to supply a current of a first magnitude, a second transistor configured to supply a current of a second magnitude, and a capacitor. The first magnitude is greater than the second magnitude and the first transistor is coupled with one side to the resistor of the first voltage divider and with the other side to a second node. The second transistor is coupled with one side to the first node and with the other side to a second supply voltage node having a second supply voltage level (for example ground). The capacitor is coupled with one side to the first node and with the other side to the first supply voltage node. This provides that the comparator can detect fast slopes in an improved way.

The electronic device according to the aspects of the invention may further comprise a short detection inverter being coupled with an input to the first supply voltage level and being coupled with an output so as to switch the LDO from the first state to the second state. This additional inverter may be useful to detect very fast slopes and to switch the LDO in response to the fast slopes with only little delay as the comparator always need a certain propagation time. In some situations this propagation delay can be too long. It is therefore advantageous to provide an short detection inverter very close to the LDO. The inverter directly reacts on changes of the first supply voltage level.

The electronic device according to aspects of the invention may then further comprise a logic gate for gating an output of the comparator and the output of the short detection inverter. The output of the logic gate can then be coupled to switch the LDO from the first state to the second state. The logic gate can be an OR-gate. The LDO is then switched from the first state to the second state in response to either of the two signals. If the short detection inverter detects a change of the first supply voltage level the LDO can be switched into the second, high impedance state. If the comparator reacts first, the LDO is switched into the high impedance state in response to the output signal of the comparator.

In another aspect of the invention, the output of the comparator can also be coupled to a second input of the short detection inverter. This prevents cross currents in the inverter, if the first supply voltage level remains at a certain voltage level and does not drop to ground.

The circuits and aspects of the invention are particularly useful for an electronic device comprising a ferroelectric random access memory (FRAM) where the second supply voltage domain is confined to supply the FRAM.

BRIEF DESCRIPTION OF DRAWINGS

Further aspects and characteristics of the invention will ensue from the following description of the preferred embodiments of the invention with reference to the accompanying drawings, wherein.

DETAILED DESCRIPTION OF EMBODIMENTS

Figure 1:
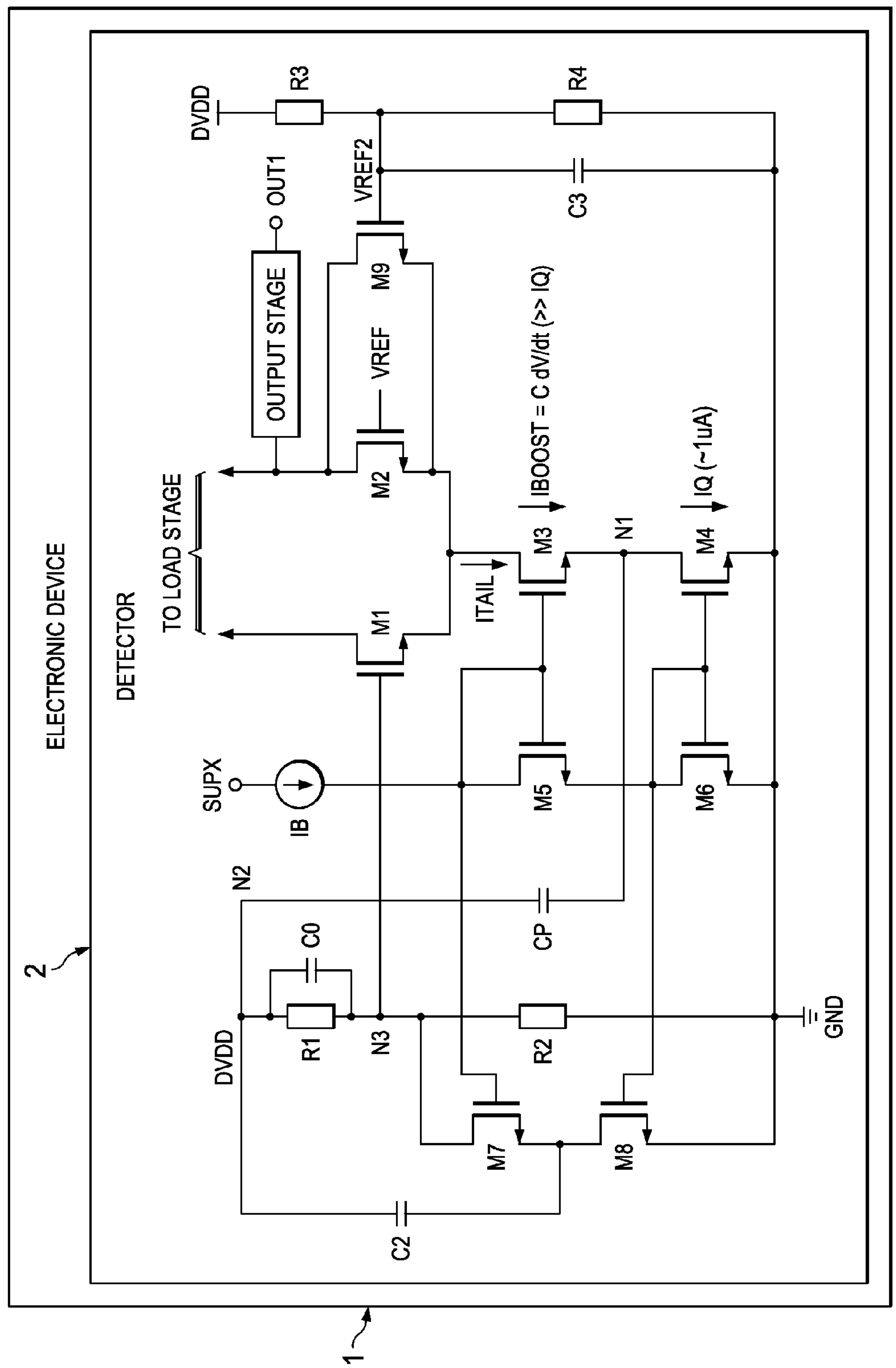
FIG. 1 shows a simplified circuit diagram of an embodiment of the invention.

FIG. 1 shows a simplified circuit diagram of an electronic device 1 comprising a circuitry that is implemented in accordance with aspects of the invention. The electronic device comprises a DETECTOR 2 that is basically a comparator which is adapted in accordance with aspects of the invention. There is a differential input stage of transistors M1, M2. In this embodiment, transistors M1 and M2 are NMOS transistors. As usual for a differential pair of transistors, the transistors M1, M2 of the differential input stage are coupled at one side of the channels. Accordingly, the sources of transistors M1 and M2 are coupled together. The drains of transistors M1 and M2 may be coupled to a load stage or other stages of the comparator which are not shown. Several possibilities and configurations exist for the load stage which are known to the person skilled in the art. The drain of transistor M2 is coupled to an output stage. The output stage performs at least an inversion of the signal at the drain of M2 and outputs the output signal OUT1. The sources of transistors M1, M2 of the differential input stage are coupled to the drain of transistor M3 which is configured as the first current source. A tail current or bias current ITAIL is drawn from the common source node of transistors M1 and M2 for biasing the differential input stage and defining the reaction time of the differential pair. The source of transistor M3 is coupled to the drain of transistor M4 at node N1. Transistor M4 operates as the second current source. The source of transistor M4 is coupled to ground or any other supply voltage level lower than the first supply voltage level DVDD present at node N2. The currents through transistor M3 and M4 are basically defined by the width to length ratio of the channels and the current mirror configurations provided by transistors M5 and M6. Accordingly, there is a first current mirror of transistors M5 and M3 for supplying a current IBOOST. There is a second current mirror M6, M4 which is configured to provide current IQ through transistor M4. IQ is much smaller than IBOOST. This means that the magnitude of the current through transistor M3 (first current source) is greater than the magnitude of the current IQ through transistor M4 (the second current source). The first current source (M3) and the second current source (M4) are coupled in series. This configuration is also known and referred to as cascode, wherein transistor M3 is the cascode device. Therefore, the current through the two current sources M3 and M4 is dominated by current source M4, so that only the smaller current IQ is drawn from the differential input pair under normal operating conditions, i.e. while DVDD (first supply voltage level) does not change, i.e. is static. Accordingly, the differential input stage M1, M2 is biased with a very small current IQ and has therefore a rather long reaction time. The currents through transistors M5 and M6 are defined by a current source IB which feeds a current to the diode-coupled transistors M5 and M6. The ratio of the currents IBOOST and IQ can then be defined by the mirroring factors of M5 and M3 as well as M6 and M4. A capacitor CP is coupled to the first node N1 between transistors M3 and M4. One side of capacitor CP is coupled to the source of M3 and to the drain of M4 at node N1. The other side of capacitor CP is coupled to the first apply voltage node N2, i.e. to the first supply voltage level DVDD. A resistive divider of resistors R1 and R2 is also coupled to the first supply voltage node N2. Node N3 between resistor R1 and R2 is coupled to the control gate of transistor M1 of the differential input stage. The control gate of the other transistor M2 of the differential input stage is coupled to receive a reference voltage level. The voltage level at node N3 (the node between resistors R1 and R2) is then an indicator of the voltage level of DVDD at the first supply voltage node N2. Coupling the comparator input voltage through the capacitor to the source of the cascode device M3 leads to a relationship between the tail current and the rate of change of the input voltage of $$ITAIL = CPval \cdot \frac{dv}{dt},$$

wherein CPval is the capacitance value of capacitor CP and V is the voltage level DVDD at the first supply voltage node N2. The tail current ITAIL increases with the drop rate dV/dt of the input voltage DVDD multiplied by the capacitance value of the capacitor CP. In response to the voltage drop, the tail current ITAIL increases which enhances the speed of the circuit. The output voltage OUT1 changes if the level of the voltage at node N3 falls below VREF. Due to the capacitor CP coupled between N2 and N1, the comparator delay is substantially reduced if the voltage level at the first supply voltage node N2 (the first supply voltage level DVDD) drops. A delay of approximately 1 ns may be achieved with the comparator. Short circuit events at node N2 (supply voltage level DVDD suddenly drops) may then instantaneously be detected.

In accordance with aspects of the invention, the differential input stage comprises a third transistor M9. This third transistor is coupled in parallel to the second transistor M2. Accordingly, the drains of transistors M2 and M9 are coupled together and the sources of transistors M2 and M9 are also coupled together. The control gate of transistor M9 provides a third input for the differential stage. This third input is coupled to receive a second reference voltage VREF2 that is derived from the first supplied voltage level DVDD. There is a voltage divider comprising resistors R3 and R4 which are coupled in series between the first supply voltage level DVDD and ground. The divided second reference voltage VREF2 is tabbed from the node between resistors R3 and R4. There is a capacitor C3 coupled in parallel to resistor R4 for buffering the second reference voltage VREF2. Due to the time constant of C3 and R4, the second reference voltage level VREF2 is maintained and drops slower than the first supply voltage level DVDD. Furthermore, the resistive divider R3, R4 is dimensioned such that the second reference voltage level VREF2 is higher (closer to the first supply voltage level DVDD) than the first reference voltage level VREF. Furthermore, VREF is a fixed reference voltage level that does not change if the first voltage supply level DVDD changes.

Furthermore, there is a further slope detection mechanism which is implemented by transistors M7, M8 and capacitor C2. Similar to the configuration implemented by transistors M3, M4 and CP, transistors M7, M8 and C2 served to detect rather fast slopes of the first supply voltage level DVDD. Transistor M7 is coupled with its drain to node N3 and with its source to the drain of transistor M8. The source of transistor M8 is coupled to ground. The control gate of transistor M7 is coupled together with the drain and gate of transistor M5 and the control gate of transistor M8 is coupled together with drain and gate of transistor M6. Accordingly, the bias current through transistor M5 and M6 is mirrored into transistors M7 and M8. The capacitor C2 is coupled to the source of transistor M7 and the drain of transistor M8 with one side. With the other side, the capacitor C2 is coupled to the first supply voltage level DVDD.

There is a capacitor CO coupled in parallel to resistor R1 for buffering and maintaining the voltage across R1 for a certain time if the first supply voltage level DVDD drops. If the first supply voltage level DVDD drops with a rather steep slope, the capacitor C2 provides that the current through the chamber of transistor M7 increases rather instantaneously and node N3 is pulled down rather quickly.

Further aspects of the functionality and operation of the circuit shown in FIG. 1 are explained further below with reference to FIG. 3.

Figure 2:
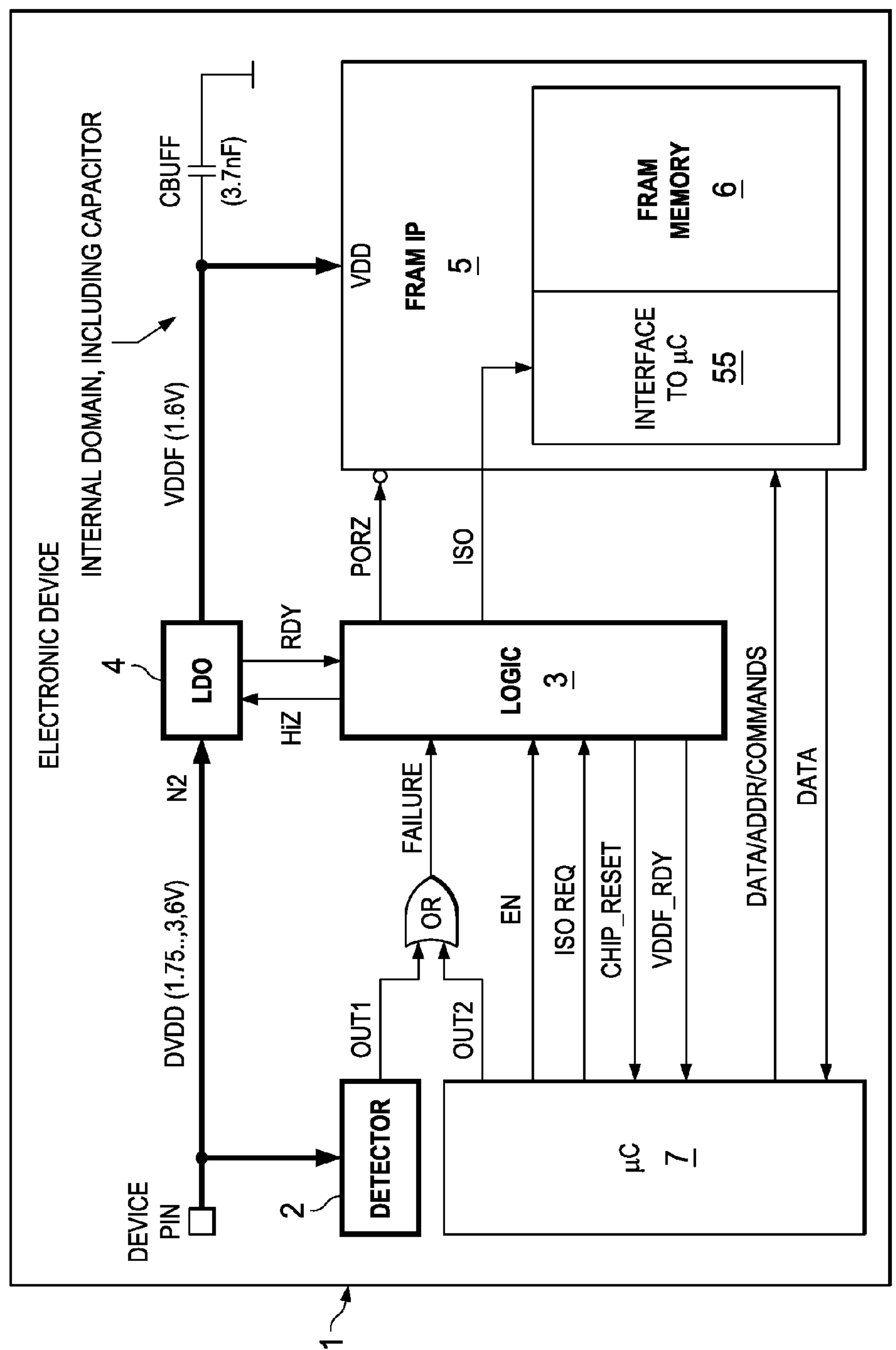
FIG. 2 shows a simplified circuit diagram of an electronic device comprising an FRAM to which the aspects of the invention can be applied.

FIG. 2 shows a simplified circuit block diagram of a system using the DETECTOR 2 and thereby the adaptively biased comparator in accordance with aspects of the invention. The system includes the DETECTOR 2 which basically comprises the circuit shown in FIG. 1. There is further an FRAM memory device 5 which is supplied in an internal second supply voltage domain having a supply voltage level VDDF. The supply voltage level VDDF (second supply voltage level) may be 1.6 Volt. The FRAM includes memory 6 and an interface for receiving and transmitting data and/or control information. The control circuitry of the FRAM 5 can be initialized through a signal PORZ. Furthermore, there might be an isolation signal ISO for switching the interface of the FRAM memory 6 into high ohmic state. The second supply voltage level VDDF of the second supply voltage domain is buffered by a capacitor CBUFF. Furthermore there is a voltage regulator LDO 4, and a logic circuit 3. The adaptively biased comparator in DETECTOR 2 is coupled to the first supply voltage level DVDD at node N2. The first supply voltage level DVDD may have a voltage range from 1.75 V to 3.6 V. Furthermore, there might be a microcontroller μC 7. The output OUT1 of the DETECTOR 2 (the output OUT1 of the comparator shown in FIG. 1) is then coupled to an input of an OR gate OR. The other input of the OR gate OR is coupled to an output OUT2 of the μC 7. The output of the OR gate provides the signal FAILURE which indicates, if triggered by signal OUT1, that the first supply voltage level DVDD at node N2 is below a threshold level, which is detected by DETECTOR 2. Accordingly, the logic 3 receives the failure signal FAILURE from either the μC 7 or DETECTOR 2 through the OR gate and if either of the two stages dectector 2 or μC 7 issues the respective failure signal, LOGIC stage 3 can switch the voltage regulator LDO 4 into a high ohmic state through signal HiZ. the voltage regulator LDO 4 may issue a signal RDY which signals that the LDO is ready to supply current after it has been enabled. Accordingly, in response to a failure of the first supply voltage level DVDD, the output of the voltage regulator LDO 4 may be switched immediately into a high ohmic state. This isolates the second supply voltage domain (internal domain with supply voltage level VDDF) and the FRAM 5 may only be supplied by the charge stored on buffer capacitor CBUFF. This amount of charge (or energy) is just sufficient for finishing a complete write-back cycle. The signals issued by logic 3 may then be the power on reset signal PORZ and the isolation signal ISO for isolating and switching down the FRAM. The signal PORZ is asserted after a delay which is sufficiently long to let the FRAM complete an ongoing access cycle. Assertion of the signal PORZ initializes the control circuitry in the FRAM DETECTOR 2 (comprising the comparator shown in FIG. 1). Detector 2 may also be supplied by a different supply voltage, different from the first supply voltage level DVDD. There are various further signals EN, ISO-REQ, CHIP-RESET and VDDF-RDY transmitted between logic circuit 3 and μC 7 which serve to enable logic 3 (EN) request isolation of the interface of the FRAM (ISO-REQ), reset μC 7 (CHIP-RESET) and inform μC 7 that the internal (second) supply voltage level VDDF is ready (VDDF-RDY). The output signal of the comparator is then signal OUT1. The comparator and the capacitor are part of DETECTOR 2. In this embodiment, DETECTOR 2 may be one of several stages of an electronic device 1, which may be an integrated electronic device. The electronic device 1 shown in FIG. 2 is a complete system that benefits substantially from DETECTOR 2 including the comparator shown in FIG. 1.

The FRAM 5 supply voltage VDDF is buffered with an integrated capacitor CBUFF of, for example 3.7 nF. The capacitor CBUFF holds a charge reserve at all times to complete an ongoing memory access, including write-back, even when the LDO 4 (voltage regulator is cut off). A detector circuit DETECTOR 2 at the input node N2 of the LDO 4 constantly monitors the overall chip supply for DVDD at node N2. The FRAM 5 is designed to perform self-timed memory access without interaction with the microcontroller μC 7. If the input voltage DVDD fails, the interface 55 of the FRAM 5 to the μC7 is isolated, suppressing further memory access requests. Additionally, the LDO 4 is disconnected from the internal supply (second voltage domain VDDF), leaving the buffer capacitor CBUFF as the only source for completing an ongoing memory access. At the same time, the microcontroller μC 7 can be reset. For the detector circuit DETECTOR 2, a very fast response time is required. In order to achieve this fast response, without spending too much additional power, the new adaptive biasing scheme for the differential input stage of the comparator is provided. The current mirrors M5 and M3, as well as M6 and M4 generally provide a low biasing current through the input stage M1, M2, of the comparator as long as the first voltage level rises or remains constant. The capacitor CP, which is coupled between node N2 and the source of the cascode device M3 increases the comparators tail current (ITAIL) when the input voltage drops. Comparator delays in the range of 1 ns may then be achieved while the quiescent current of the comparator can be as low as 1 mA.

However, even with the adaptively biased comparator, there are situations where the duration for switching the LDO in a high impedance state is too long. This is due to the various different voltage levels of the first voltage supply DVDD. If the first voltage supply level DVDD is higher, it takes longer until the voltage node N3 (shown in FIG. 1), i.e. the first input of the differential stage, drops below the first reference voltage level VREF. However, according to aspects of the invention, there is a second variable reference voltage level VREF2 that serves to detect voltage drops independently from the absolute voltage level of the first voltage supply. Since the resistors R3 and R4 are dimensioned such that the second reference voltage level VREF2 is closer to the first supply voltage level DVDD then the first reference voltage level VREF, this provides, that the comparator switches earlier in response to a voltage drop of the first supply voltage level DVDD. This behavior is further illustrated in FIG. 3.

Figure 3:
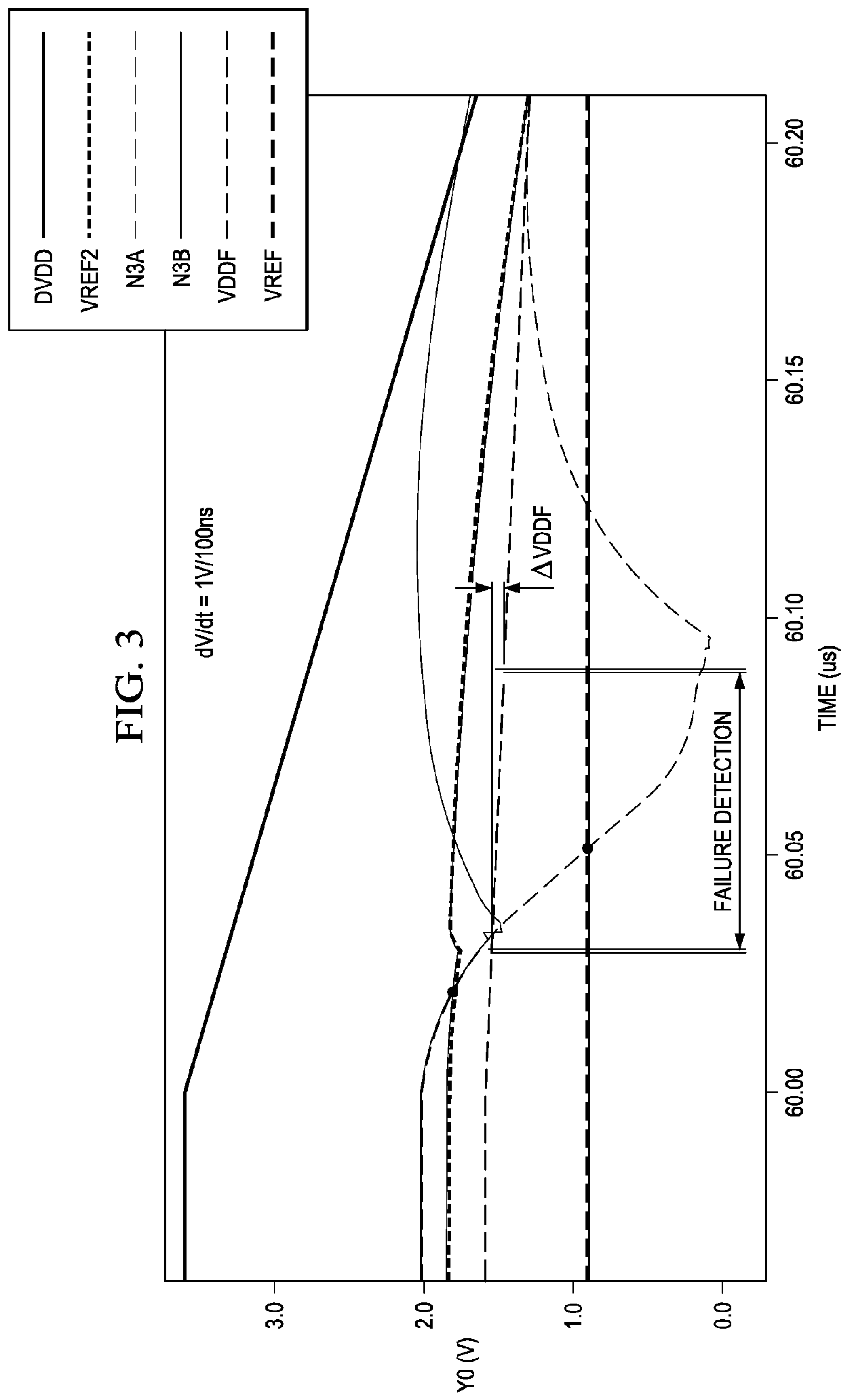
FIG. 3 shows a diagram of waveforms relating to the embodiment of the invention shown in FIG. 1.

FIG. 3 shows waveforms relating to the embodiment of the invention shown in FIG. 1. The first supply voltage level DVDD drops with a slope of 1 V per 100 ns. FIG. 3 shows the fixed reference voltage level VREF and the variable second reference voltage level VREF2. The dashed lines N3A and N3B relate to a comparator with only two inputs of the differential stage (without a second reference voltage level VREF2) and a comparator with three inputs using the second reference voltage level VREF2, respectively. Since VREF2 is buffered by capacitor C2, it drops rather slowly. Accordingly, if the voltage node N3 drops, the comparator having three inputs triggers already at the crossing point of N3B and VREF2. Without a third input, the comparator triggers only when N3A crosses the fixed first reference VREF. This means that with the comparator according to the aspects of the invention any failure of the first voltage supply is detected much earlier. This results in a significant difference in the drop of the internal voltage supply VDDF which is indicated as ΔVDDF. This means that in the embodiment shown in FIG. 2, the buffer capacitor CBUFF can be substantially smaller.

Figure 4:
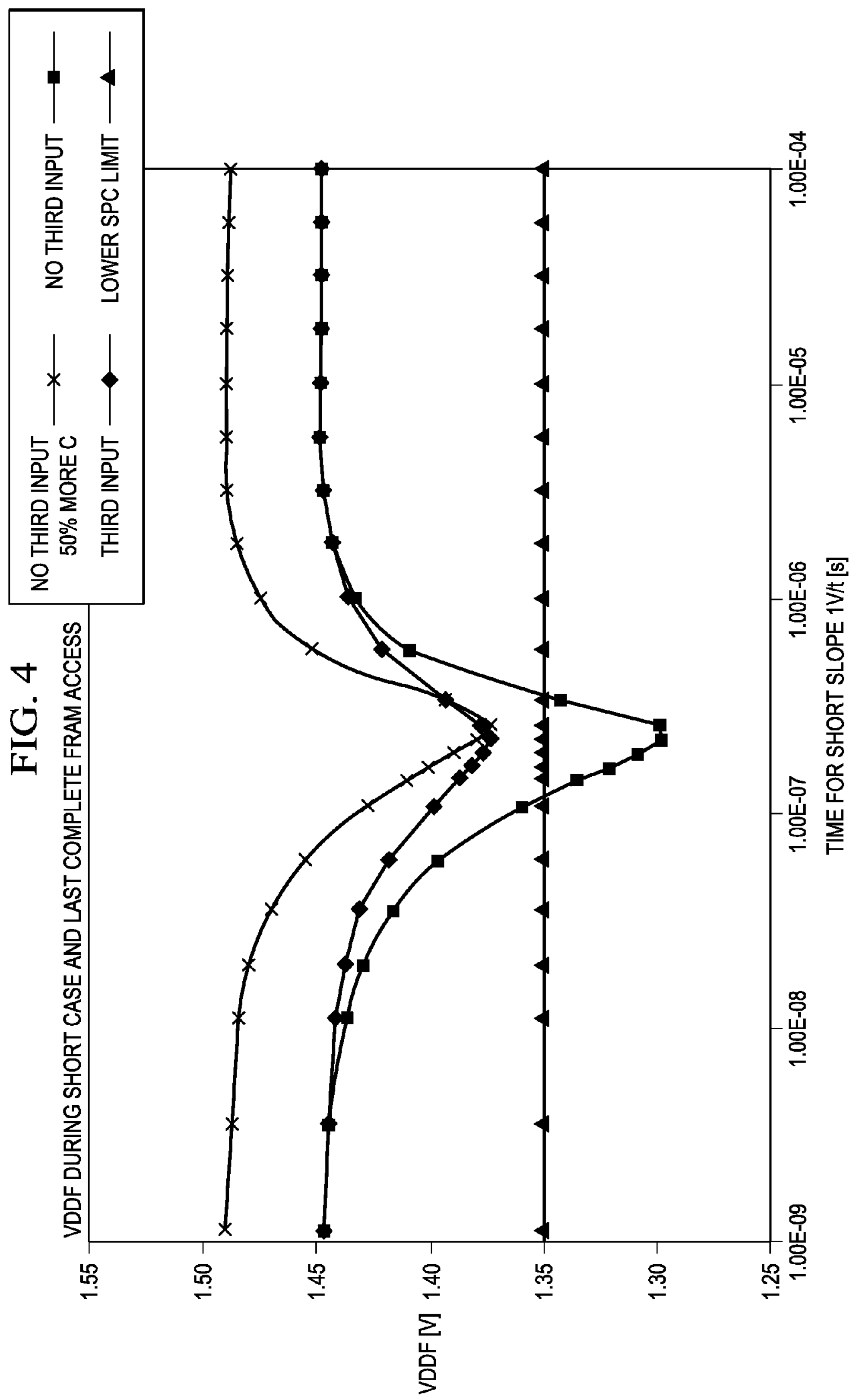
FIG. 4 shows a diagram with further waveforms for illustrating the operation of the embodiment of the invention.

FIG. 4 shows the internal second supply voltage level VDDF for a comparator with only two inputs and the comparator having three inputs according to the invention. It can be seen that the configuration with a third input prevents the internal voltage supply VDDF from dropping below the lower internal supply voltage limit (lower_SPC-LIMIT). In order to achieve the same effect, the internal buffer capacitor CBUFF has to be increased by about fifty percent as indicated by the line referred to as no_Third_Input_50% moreC.

Figure 5:
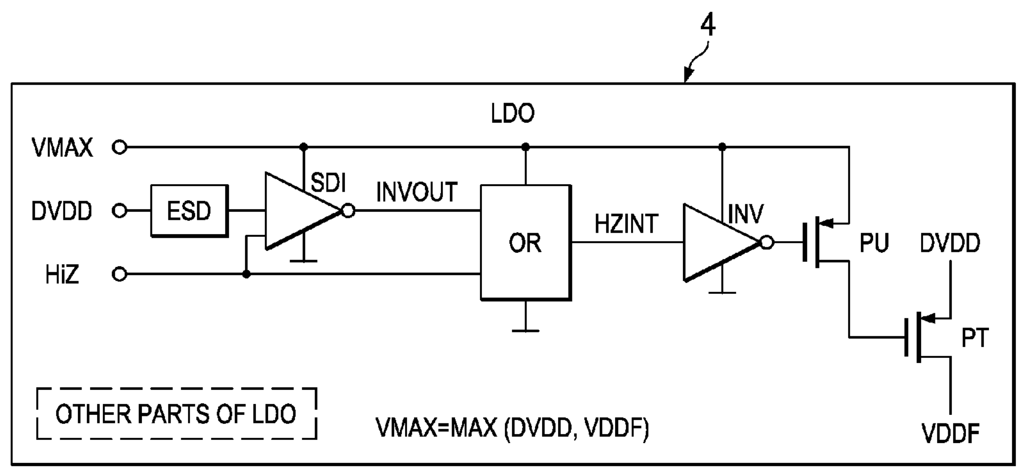
FIG. 5 shows a simplified circuit diagram of another embodiment of the invention.

FIG. 5 shows a simplified circuit diagram of another aspect of the invention. Even with the comparator described with respect to FIG. 1 to FIG. 4, there are situations where a very sudden voltage drop of the supply voltage cannot be detected. This is due to the inherent delay of the comparator. Therefore, a short detection inverter SDI is provided that is directly coupled to the first supply voltage level DVDD. The output INVOUT of the inverter SDI is then fed to, for example the control gate of transistor PU. The source of transistor PU is coupled to VMAX. VMAX is the maximum of supply voltage levels DVDD and VDDF (VMAX=max(DVDD, VDDF)). The drain of transistor PU is coupled to pass transistor PT of the LDO 4. The pass transistor PT is coupled with its source to DVDD and with its drain to VDDF. The short detection inverter is coupled to switch the LDO 4 into a high impedance state in response to a drop of the first voltage supply level. There is further an OR-gate for combining the output INVOUT of the inverter INV and signal HiZ in order to ensure that the LDO is also shut down if the DETECTOR 2 responds to a change of DVDD. Accordingly, this kind of short detection inverter is placed inside the LDO 4 in front of a gate that can serve to isolate the LDO 4. For very steep slopes (for example, the first voltage supply DVDD drops by 1 V in less than 5 ns) the short detection inverter responds much faster than the comparator. In order to protect the short detection inverter SDI against cross current and charge loss, for example if DVDD does not drop to ground, the trigger signal HiZ from the comparator can be gated with the voltage level at DVDD.

Figure 6:
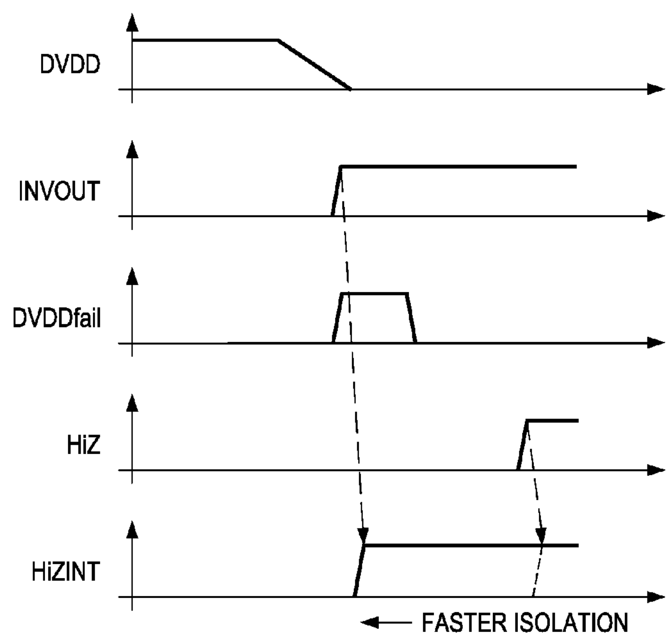
FIG. 6 shows a diagram of waveforms relating to the embodiment shown in FIG. 5.

FIG. 6 shows waveforms illustrating the operation of the embodiment shown in FIG. 5. If DVDD drops, the inverter output INVOUT of short detection inverter SDI changes from LOW to HIGH. If the first voltage supply level fails totally (indicated by DVDDfail) the signal issued by the comparator (HiZ) also changes the state from LOW to HIGH. However, due to the faster response of the short detection inverter SDI, the internal signal HiZINT switches much earlier from LOW to HIGH and isolates the LDO 4. This provides that, for example the FRAM shown in FIG. 2 is isolated much earlier and less charge from the buffer capacitor CBUFF is lost. Therefore, the capacitance value of the buffer capacitor CBUFF can be reduced.

Figure 7:
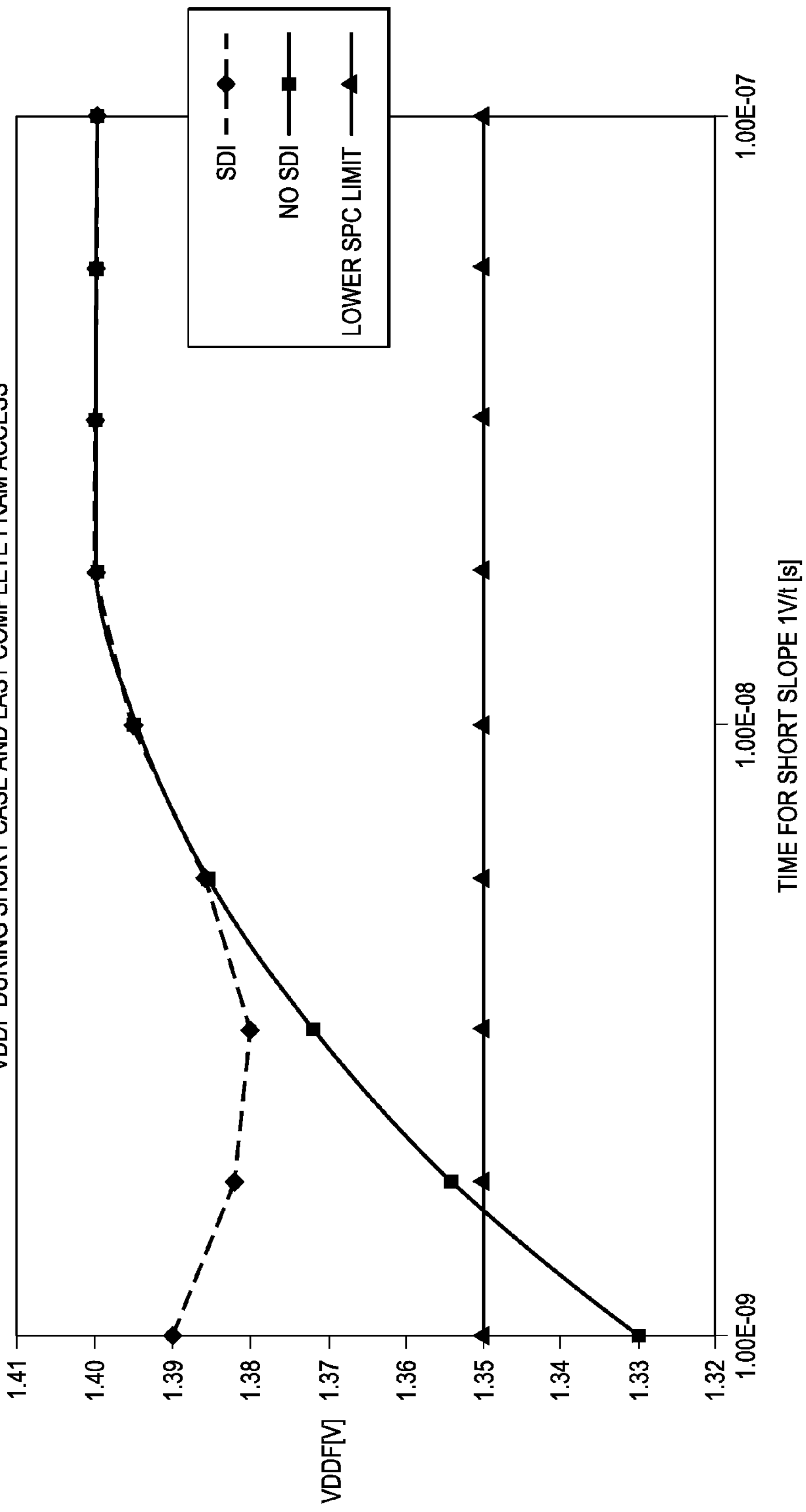
FIG. 7 shows further waveforms for illustrating the operation of the embodiment shown in FIG. 5.

FIG. 7 shows the internal supply voltage VDDF for situations with and without short detection inverter SDI. It can be seen that the internal voltage level VDDF remains above 1.38 V if the short detection inverter SDI in accordance with the invention is used. Furthermore, with the short detection inverter SDI, the voltage level VDFF never drops below the lower supply voltage limit of 1.35 V.

Although the invention has been described in detail, it should be understood that various changes, substitutions and alterations can be made thereto without departing from the spirit and scope of the invention as defined by the appended claims.

The invention claimed is:

1. An electronic device comprising:

a first supply voltage domain;

a second supply voltage domain;

a low drop output voltage regulator (LDO) coupled to receive a supply voltage of the first supply voltage domain and to provide a supply voltage of the second supply voltage domain;

the LDO being configured to be switched into a first state for providing and maintaining the supply voltage of the second supply voltage domain and into a second state for providing a high impedance output to the second supply voltage domain;

a comparator coupled to monitor the first supply voltage level at a first supply voltage node and to switch the LDO from the first state to the second state, the comparator comprising a differential input transistor stage having one input coupled to the first supply voltage node and another input coupled to receive a first reference voltage level, a first current source configured to supply a current of a first magnitude, a second current source configured to supply a current of a second magnitude, and a capacitor, wherein the first magnitude is greater than the second magnitude and the first current source is coupled with one side to the differential input stage for supplying the differential input stage and with the other side to a first node, the second current source is coupled with one side to the first node and with the other side to a second supply voltage node having a second supply voltage level and the capacitor is coupled with one side to the first node and with the other side to the first supply voltage node, and wherein the differential stage comprises a third input being coupled to receive a second reference voltage that is derived from the supply voltage level at the first supply voltage node.

2. The electronic device according to claim 1, wherein the differential stage comprises a first input transistor, a second input transistor and a third input transistor, the first input transistor being coupled with a control gate to the first supply voltage node, the second input transistor being coupled with a control gate to the first reference voltage and the third input transistor being coupled with a control gate to the second reference voltage.

3. The electronic device according to claim 2, further comprising a first voltage divider coupled to the first supply voltage node and configured to supply a divided supply voltage of the first voltage domain to the control gate of the first input transistor.

4. The electronic device according to claim 3, further comprising a second voltage divider coupled to the first supply voltage node and configured to supply a divided supply voltage of the first voltage domain to the control gate of the third input transistor.

5. The electronic device according to claim 4, wherein the third transistor is coupled in parallel to the second transistor.

6. The electronic device according to claim 4, further comprising slope detection stage that is coupled in parallel to a resistor of the first voltage divider, the slope detection stage comprising two transistors coupled in series, a first transistor configured to supply a current of a first magnitude, a second transistor configured to supply a current of a second magnitude, and a capacitor, wherein the first magnitude is greater than the second magnitude and the first transistor is coupled with one side to the resistor of the first voltage divider and with the other side to a second node, the second transistor is coupled with one side to the first node and with the other side to a second supply voltage node having a second supply voltage level and the capacitor is coupled with one side to the first node and with the other side to the first supply voltage node.

7. The electronic device according to claim 4, further comprising a short detection inverter being coupled with an input to the first supply voltage level and being coupled with an output so as to switch the LDO from the first state to the second state.

8. The electronic device according to claim 3, wherein the third transistor is coupled in parallel to the second transistor.

9. The electronic device according to claim 8, further comprising slope detection stage that is coupled in parallel to a resistor of the first voltage divider, the slope detection stage comprising two transistors coupled in series, a first transistor configured to supply a current of a first magnitude, a second transistor configured to supply a current of a second magnitude, and a capacitor, wherein the first magnitude is greater than the second magnitude and the first transistor is coupled with one side to the resistor of the first voltage divider and with the other side to a second node, the second transistor is coupled with one side to the first node and with the other side to a second supply voltage node having a second supply voltage level and the capacitor is coupled with one side to the first node and with the other side to the first supply voltage node.

10. The electronic device according to claim 8, further comprising a short detection inverter being coupled with an input to the first supply voltage level and being coupled with an output so as to switch the LDO from the first state to the second state.

11. The electronic device according to claim 3, further comprising slope detection stage that is coupled in parallel to a resistor of the first voltage divider, the slope detection stage comprising two transistors coupled in series, a first transistor configured to supply a current of a first magnitude, a second transistor configured to supply a current of a second magnitude, and a capacitor, wherein the first magnitude is greater than the second magnitude and the first transistor is coupled with one side to the resistor of the first voltage divider and with the other side to a second node, the second transistor is coupled with one side to the first node and with the other side to a second supply voltage node having a second supply voltage level and the capacitor is coupled with one side to the first node and with the other side to the first supply voltage node.

12. The electronic device according to claim 3, further comprising a short detection inverter being coupled with an input to the first supply voltage level and being coupled with an output so as to switch the LDO from the first state to the second state.

13. The electronic device according to claim 2, wherein the third transistor is coupled in parallel to the second transistor.

14. The electronic device according to claim 13, further comprising slope detection stage that is coupled in parallel to a resistor of the first voltage divider, the slope detection stage comprising two transistors coupled in series, a first transistor configured to supply a current of a first magnitude, a second transistor configured to supply a current of a second magnitude, and a capacitor, wherein the first magnitude is greater than the second magnitude and the first transistor is coupled with one side to the resistor of the first voltage divider and with the other side to a second node, the second transistor is coupled with one side to the first node and with the other side to a second supply voltage node having a second supply voltage level and the capacitor is coupled with one side to the first node and with the other side to the first supply voltage node.

15. The electronic device according to claim 2, further comprising slope detection stage that is coupled in parallel to a resistor of the first voltage divider, the slope detection stage comprising two transistors coupled in series, a first transistor configured to supply a current of a first magnitude, a second transistor configured to supply a current of a second magnitude, and a capacitor, wherein the first magnitude is greater than the second magnitude and the first transistor is coupled with one side to the resistor of the first voltage divider and with the other side to a second node, the second transistor is coupled with one side to the first node and with the other side to a second supply voltage node having a second supply voltage level and the capacitor is coupled with one side to the first node and with the other side to the first supply voltage node.

16. The electronic device according to claim 2, further comprising a short detection inverter being coupled with an input to the first supply voltage level and being coupled with an output so as to switch the LDO from the first state to the second state.

17. The electronic device according to claim 1, further comprising slope detection stage that is coupled in parallel to a resistor of the first voltage divider, the slope detection stage comprising two transistors coupled in series, a first transistor configured to supply a current of a first magnitude, a second transistor configured to supply a current of a second magnitude, and a capacitor, wherein the first magnitude is greater than the second magnitude and the first transistor is coupled with one side to the resistor of the first voltage divider and with the other side to a second node, the second transistor is coupled with one side to the first node and with the other side to a second supply voltage node having a second supply voltage level and the capacitor is coupled with one side to the first node and with the other side to the first supply voltage node.

18. The electronic device according to claim 1, further comprising a short detection inverter being coupled with an input to the first supply voltage level and being coupled with an output so as to switch the LDO from the first state to the second state.

19. The electronic device according to claim 18, further comprising a logic gate for gating an output of the comparator and the output of the short detection inverter, wherein the output of the logic gate is coupled to switch the LDO from the first state to the second state.

20. The electronic device according to claim 19, wherein the output of the comparator is coupled to a second input of the short detection inverter.

21. The electronic device according to claim 1, further comprising a ferroelectric random access memory (FRAM) wherein the second supply voltage domain is confined to supply the FRAM.

* * * * *